(12) United States Patent
Nakama (10) Patent No.: US 6,239,891 B1
(45) Date of Patent: May 29, 2001

(54) OPTICAL DEMULTIPLEXER AND METHOD OF ASSEMBLING SAME

(75) Inventor: Kenichi Nakama, Osaka (JP)

(73) Assignee: Nippon Sheet Glass Ltd., Co, Osaka (JP)

(*) Notice: Subject to any disclaimer, the term of this patent is extended or adjusted under 35 U.S.C. 154(b) by 0 days.

(21) Appl. No.: 09/437,794

(22) Filed: Nov. 10, 1999

Related U.S. Application Data

(63) Continuation of application No. PCT/JP99/01192, filed on Mar. 11, 1999.

(30) Foreign Application Priority Data

Mar. 11, 1998 (JP) .................................................. 10-078414

(51) Int. Cl.$^7$ ................................ H04J 14/02; G02B 5/18
(52) U.S. Cl. ............................ 359/131; 359/130; 359/572
(58) Field of Search ..................................... 359/130, 634, 359/562, 566, 569, 572, 131

(56) References Cited

U.S. PATENT DOCUMENTS

| | | | |
|---|---|---|---|
| 4,747,655 | * | 5/1988 | Shirasaki ........................... 350/96.16 |
| 5,101,389 | * | 3/1992 | Ohuchida et al. ................. 369/44.23 |
| 5,107,359 | * | 4/1992 | Ohuchida ............................ 359/124 |
| 5,745,271 | * | 4/1998 | Ford et al. .......................... 359/130 |
| 5,917,625 | * | 6/1999 | Ogusu et al. ....................... 359/130 |
| 6,016,212 | * | 1/2000 | Durant et al. ...................... 359/124 |

FOREIGN PATENT DOCUMENTS

| | | | |
|---|---|---|---|
| 07030485A | 1/1995 | (JP) | ............................... H04B/10/02 |
| 07077627A | 3/1995 | (JP) | ............................... G02B/6/293 |
| 08005861A | 1/1996 | (JP) | ............................... G02B/6/293 |
| 08075948A | 3/1996 | (JP) | ............................... G02B/6/293 |
| 08086932A | 4/1996 | (JP) | ............................... G02B/6/293 |
| 09073020A | 3/1997 | (JP) | ............................... G02B/6/12 |
| 09243855A | 9/1997 | (JP) | ............................... G02B/6/293 |

OTHER PUBLICATIONS

"20–Channel Micro–Optic Grating Demultiplexer for 1.1–1.6 Band Using a Small Focusing Parameter Graded–Index Rod Lens", *Electronic Letters*, 18(6), pp. 257–258, (Mar. 1982).

Kobayashi, K., et al., "Microoptic Grating Multiplexers and Optical Isolators for Fiber–Optic Communications", *IEEE— Journal of Quantum Electronics*, QE–16(1), pp. 11–22, (Jan. 1980).

Lipson, J., et al., "A Six–Channel Wavelength Multiplexer and Demultiplexer For Single Mode Systems", *Journal of Lightwave Technology*, LT–3(5), pp. 1159–1163, (Oct. 1985).

Masahiro, O., et al., "Thermally stable Littrow mounted optical wavelength MUX", *Technical Report of the Institute of Electronics, Information, and Communication Engineers*, pp. 27–32, (1995).

McMahon, D.H., et al., "Echelon grating multiplexers for hierarchically multiplexed fiber–optic communications networks", *Applied Optics*, 26(11), pp. 2188–2196, (Jun. 1987).

\* cited by examiner

*Primary Examiner*—Leslie Pascal
*Assistant Examiner*—Dalzid Singh
(74) *Attorney, Agent, or Firm*—Schwegman, Lundberg, Woessner & Kluth, P.A.

(57) ABSTRACT

An optical demultiplexer has light input means, a collimator lens, a substrate with a diffraction grating formed thereon, and light detecting means for detecting light demultiplexed by the diffraction grating. The diffraction grating comprises a reflective diffraction grating having a reflecting surface. The light input means and the light detecting means face the reflective diffraction grating with the collimator lens interposed therebetween. The reflecting surface includes a light transmitting area in at least a portion thereof. An optical demultiplexer having an input optical fiber, a collimator lens, a diffraction grating having a reflecting surface which includes a partial light transmitting area, and light detecting means for detecting light demultiplexed by the diffraction grating is assembled by monitoring light having passed through the light transmitting area and adjusting the position of the optical axis of the diffraction grating.

11 Claims, 10 Drawing Sheets

UNCOATED AREA

PATTERN FORMED WHEN CIRCULAR BEAM IS APPLIED TO DIFFRACTION GRATING

OPTICAL DEMULTIPLEXER AND METHOD OF ASSEMBLING SAME

CROSS-REFERENCE TO RELATED APPLICATIONS

This application is a continuation of International Patent Application No. PCT/JP99/01192, filed on Mar. 11, 1999, which in turn is an international filing of Japanese Patent Application No. 10-78414, filed on Mar. 11, 1998, both of which are incorporated herein by reference.

TECHNICAL FIELD

The present invention relates to an optical demultiplexer primarily for use in wavelength division multiplex optical communications.

BACKGROUND ART

One conventional optical demultiplexer for use in wavelength division multiplex optical communications include an optical demultiplexer having optical fibers as input and output mediums. For example, an optical demultiplexer disclosed in Japanese laid-open patent publication No. 9-243855 has input and output optical fibers positioned at the focal point of a collimator lens. A light beam emitted from the input optical fiber is converted by the collimator lens into a parallel beam, which is applied to a Littrow reflective diffraction grating. The parallel beam applied to the Littrow reflective diffraction grating is demodulated by chromatic dispersion characteristics thereof into light beams that are focused by the collimator lens onto the end surface of the output optical fiber in respective channels. The above optical demultiplexer has performed the optical demultiplexing function as described above.

There are also known an optical demultiplexer having an optical fiber as an input medium and an optical waveguide as an output medium as disclosed in Japanese laid-open patent publication No. 8-75948, and an optical demultiplexer having an optical fiber as an input medium and a photodetector array as an output medium as disclosed in Japanese laid-open patent publication No. 7-30485.

It is important for the optical demultiplexers to achieve a desired level of accuracy for the alignment of various components. Particularly, the Littrow optical demultiplexer demands such alignment accuracy.

In the case of optical demultiplexers with reflective diffraction gratings, it is found difficult to monitor the state of a light beam applied to the diffraction grating. Therefore, efficient adjustments are hard to perform in the assembling process. When such an optical demultiplexer malfunctions, the cause of the malfunction cannot easily be identified, making it impossible to conduct quick troubleshooting.

An operation monitor such as an optical fiber amplifier for use in wavelength division multiplex optical communications is required to evaluate an average light quantity per channel. Conventional optical demultiplexers need to electrically add output power levels in respective channels and divide the sum of the output power levels by the number of channels from which the output power is obtained. Accordingly, the conventional optical demultiplexers are disadvantageous in that their electric circuit is complex and expensive.

It is therefore an object of the present invention to provide an optical demultiplexer which has a reflective diffraction grating and is capable of monitoring the state of a light beam applied to the diffraction grating, and a method of assembling such an optical demultiplexer.

DISCLOSURE OF THE INVENTION

The above object can be achieved by an optical demultiplexer according to the present invention which has a light transmitting area formed in a portion of a reflective diffraction grating.

Specifically, according to a first aspect of the present invention, an optical demultiplexer having light input means, a collimator lens, a substrate with a diffraction grating formed thereon, and light detecting means for detecting light demultiplexed by the diffraction grating, characterized in that said diffraction grating comprises a reflective diffraction grating having a reflecting surface, said light input means and said light detecting means face said reflective diffraction grating with said collimator lens interposed therebetween, said reflecting surface including a light transmitting area in at least a portion thereof.

According to an invention described in claim 2, in an optical demultiplexer according to claim 1, said light transmitting area is an area where said reflecting surface is not formed.

According to an invention described in claim 3, in an optical demultiplexer according to claim 1, said light transmitting area is an area of low reflectivity.

According to an invention described in claim 4, in an optical demultiplexer according to claim 1, said substrate is disposed such that an angle at which light applied to said light transmitting area passes through said diffraction grating and is applied to the reverse side of said substrate becomes smaller than an angle of total reflection of the light.

According to an invention described in claim 5, an optical demultiplexer according to claim 1 further comprises a photodetector for measuring a quantity of light, behind the substrate of said diffraction grating in alignment with said light transmitting area. The photodetector should preferably be directly mounted on the reverse side of the substrate.

According to an invention described in claim 6, in an optical demultiplexer according to claim 1, said light input means comprises an optical fiber.

According to an invention described in claim 7, in an optical demultiplexer according to claim 1, said light detecting means comprises one selected from a group consisting of an optical fiber array comprising a plurality of optical fibers, a waveguide array comprising a plurality of waveguides, and a photodetector array comprising a plurality of photodetectors.

According to an invention described in claim 8, an optical demultiplexer according to claim 1 further comprises a lens disposed behind the substrate of said diffraction grating, for focusing light having passed through said light transmitting area, and light detecting means disposed behind the substrate of said diffraction grating, for detecting the light which has passed through said light transmitting area and has been focused.

According to an invention described in claim 9, in an optical demultiplexer according to claim 1, said light detecting means comprises one selected from a group consisting of an optical fiber array comprising a plurality of optical fibers, a waveguide array comprising a plurality of waveguides, and a photodetector array comprising a plurality of photodetectors.

As described above, the present invention resides in that in the optical demultiplexer employing the reflective diffraction grating, the reflective diffraction grating has the light transmitting area for allowing applied light to be observed from the reverse side of the diffraction grating.

According to another aspect of the present invention, there is provided a method of assembling an optical demultiplexer having an input optical fiber, a collimator lens, a diffraction grating, and light detecting means for detecting light demultiplexed by the diffraction grating, characterized in that said diffraction grating comprises a reflective diffraction grating having a reflecting surface, said reflecting surface includes a light transmitting area in a portion thereof, and the optical axis of the diffraction grating is positionally adjusted while light having passed through the light transmitting area is being monitored.

BEST MODE FOR CARRYING OUT THE INVENTION

Preferred embodiments of the present invention will hereinafter be described in detail below with reference to the drawings.

(Basic arrangement of the optical demultiplexer)

A basic arrangement of an optical demultiplexer according to the present invention will first be described below.

Figure 1:
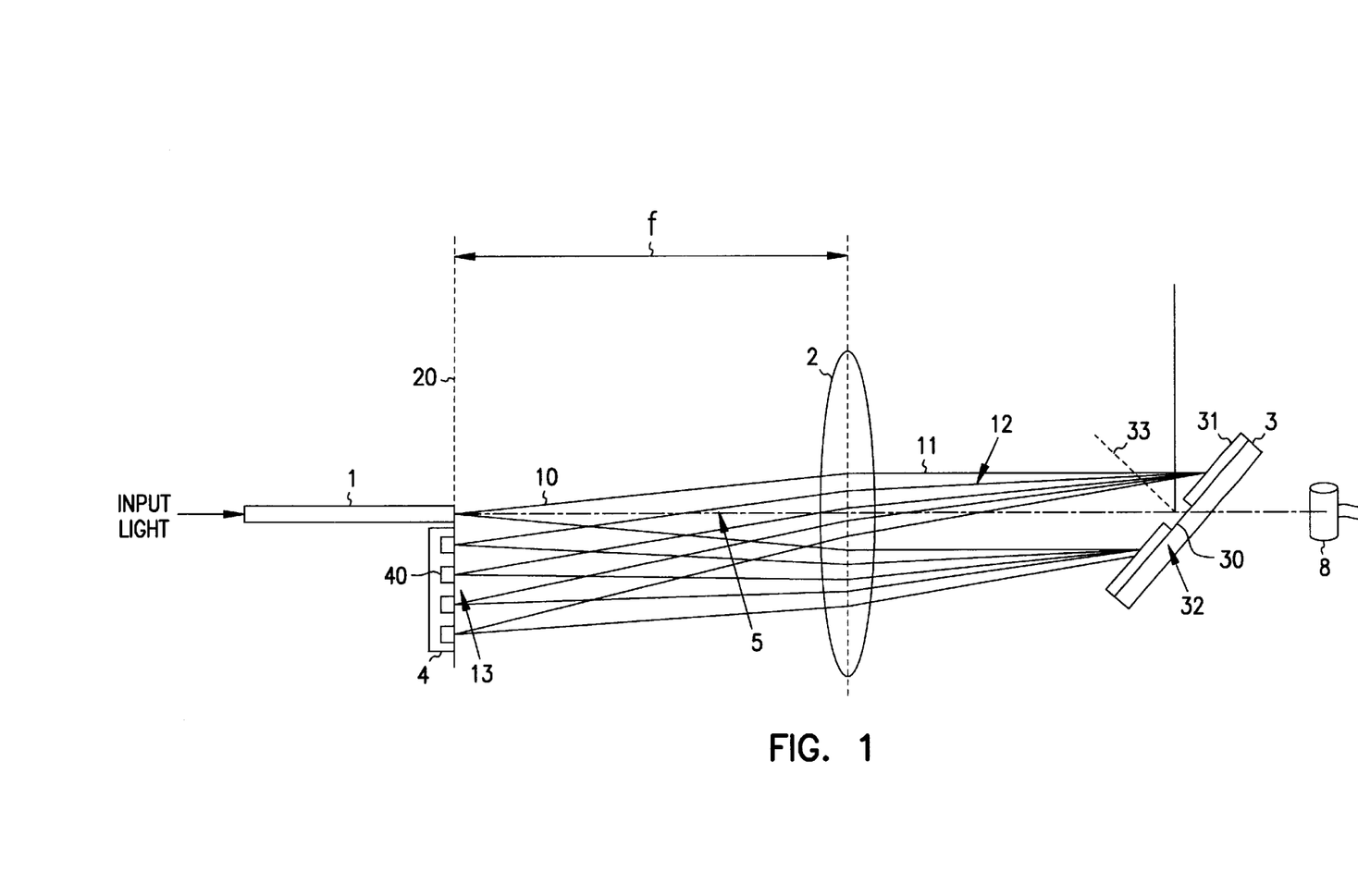
FIG. 1 is a schematic view of an overall optical demultiplexer according to an embodiment of the present invention, the optical demultiplexer employing an optical fiber as a light input means and a photodetector array as detecting means.

In an optical demultiplexer for use in wavelength division multiplex optical communications shown in FIG. 1, light beams having wavelengths ranging from $\lambda_1$ to $\lambda_0$ are multiplexed and transmitted to an optical fiber 1 which serves as a light input means.

The optical fiber 1 has an exit surface positioned on a focal plane 20 of a collimator lens 2. A light beam 10 emitted from the optical fiber 1 spreads depending on the numerical aperture of the optical fiber 1, and is converted by the collimator lens 2 into a parallel beam 11, which is applied to a diffraction grating 3. The diffraction grating 3 comprises a reflective diffraction grating having a substrate coated with a thin metal film as a reflective coating 31. The diffraction grating 3 separates the applied beam 11 and reflects light beams in respective channels depending on its chromatic dispersion characteristics.

It is assumed that the diffraction grating 3 has a diffraction order of m and a diffraction constant d, the used wavelength is represented by $\lambda_0$, and an angle formed between a normal 33 to the plane of the diffraction grating 3 and an optical axis 5 is represented by $\theta_i$, and the diffraction grating 3 is positioned to satisfy the equation:

$$\sin\theta_i = -m\lambda_0/(2d) \qquad (1)$$

so that light having the wavelength $\lambda_0$ travels back along the optical axis 5.

With the diffraction grating 3 thus positioned, reflected light beams 12 keep their angles with respect to the optical axis 5 depending on the chromatic dispersion, and reach the collimator lens 2 again.

The collimator lens 2 focuses the light beams 12 separately on the focal plane 20 off the axis of the collimator lens 2, forming a group of focused beam spots 13 in the respective channels.

A photodetector array 4 is disposed on the focal plane 20. The photodetector array 4 comprises photodetectors (effective light detecting surfaces thereof) 40 corresponding respectively to the focused beam spots 13 and arranged in an array.

In this embodiment, the number of photodetectors of the photodetector array 4 is the same as the number of demultiplexed channels. In FIG. 1, the light is demultiplexed into four channels. The optical demultiplexer is constructed as described above.

The optical demultiplexer according to this embodiment is not exactly a Littrow optical demultiplexer. However, since the optical demultiplexer is of an arrangement similar to a Littrow optical demultiplexer, its components are required to have a high level of alignment accuracy.

(Specific structural example)

Specific numerical values are given by way of example as follows:

Optical fiber: core diameter=9 $\mu$m, numerical aperture=0.1, single mode

Collimator lens: aperture=20 mm, focal length=50 mm

Input light: wavelength range=1550–1554.8 nm, the number of channels=4, wavelength interval=1.6 nm Diffraction grating: size=25 mm on each square side, diffraction order=primary, diffraction constant d=1.8 $\mu$m Photodetector array: ETX100MLA manufactured by Epitaxx (U.S.A), 22pin-DIP package.

In the example shown in FIG. 1, the reflective diffraction grating 3 is formed on a planar substrate 32. For the purpose of fixing the substrate in position, it is convenient to employ a prismatic angle block having an attachment angle that has been determined in advance by an optical design process. In the present invention, the prismatic angle block needs to be made of a light transmitting material because it is necessary to extract light behind the reflective diffraction grating and monitor the extract light with a photodetector device 6.

Specifically, the prismatic angle block may be made of Pyrex glass (tradename, manufactured by Corning), BK7 (manufactured by Schott), quartz glass, or the like.

Figure 2:
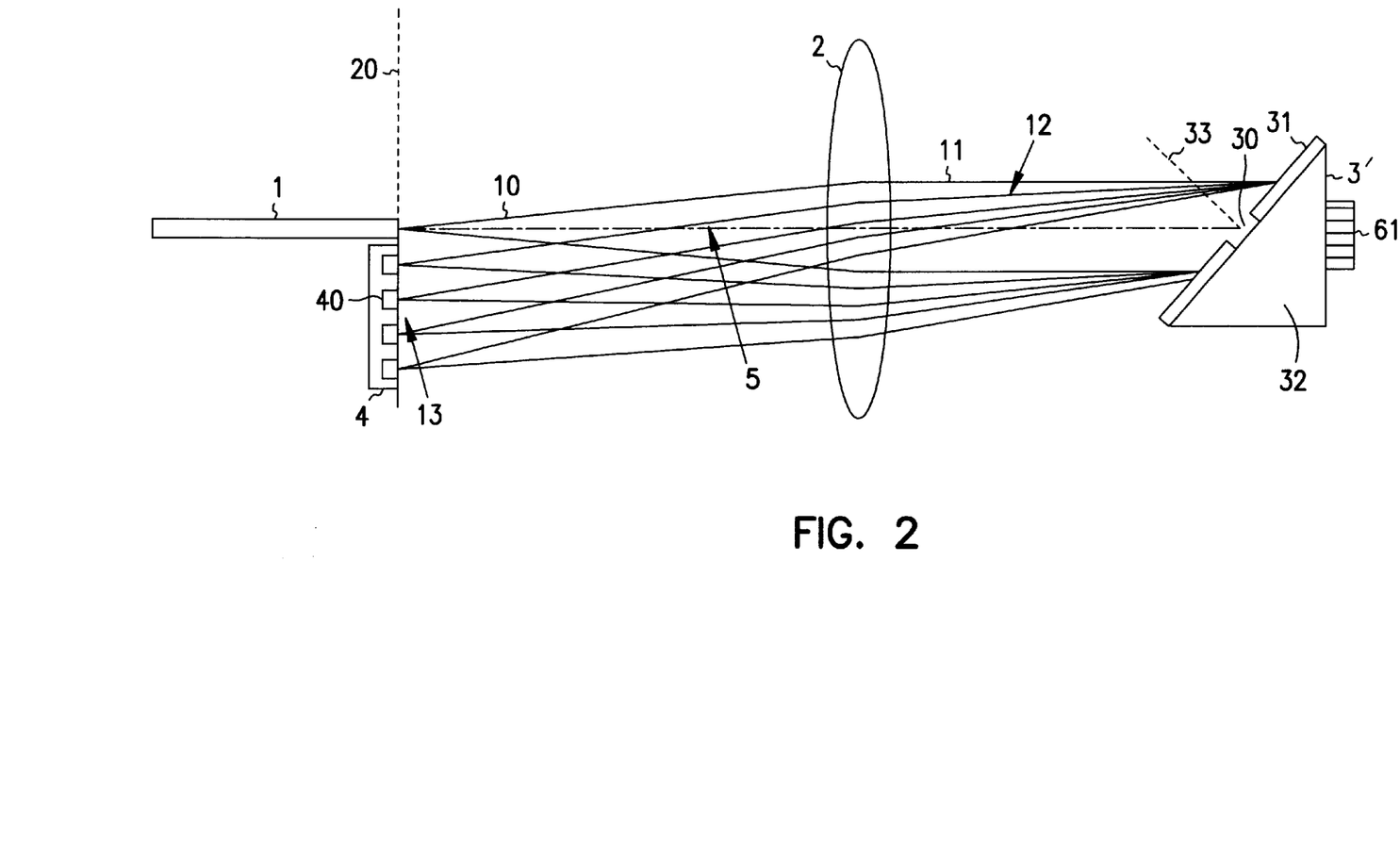
FIG. 2 is a schematic view of an overall optical demultiplexer with a reflective diffraction grating directly formed as a prismatic angle block.

The reflective diffraction grating is not limited to the above structure, but may be formed directly on a prismatic angle block (see FIG. 2).

The optical demultiplexer according to the present invention is characterized by the diffraction grating 3. The diffraction grating 3 has a light transmitting area 30 through which the position of rays of light applied to the diffraction grating can be observed and adjusted by the photodetector device 6 that is positioned behind the substrate 3.

(Explanation of the reflecting surface)

A reflecting film formed on the diffraction grating will be described below. The reflecting film may be formed by a known sputtering or evaporation process.

If the reflecting film comprises a thin metal film, then it may be made of Al, Au, etc., or an alloy. If the reflecting film comprises a dielectric film, then it may be made of $SiO_2$—$TiO_2$, $SiO_2$—$Ta_2O_5$, etc.

The light transmitting area 30 may be provided in any arbitrary number, position, and shape. The light transmitting area 30 may have a pattern such as an oblong circular shape, an elliptical shape, a lozenge shape, an elongate rectangular shape, a crisscross shape, etc. The center of gravity of the opening area of the light transmitting area 30 should preferably be positioned on the optical axis. If the light transmitting area 30 is projected onto a plane perpendicular to the optical axis, the projected shape should preferably be circular, square, or crisscross. The diffraction grating may have one or more light transmitting areas.

FIGS. 3(A) through 3(D) show specific examples of the light transmitting area 30, including an oblong circular shape, an elongate rectangular shape, a lozenge shape, and a crisscross shape, respectively.

Figure 3A:
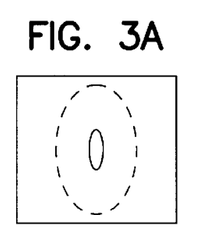
FIGS. 3(A) through 3(H) are plan views showing the shapes of light transmitting areas for use on the reflecting surface of a diffraction grating.
Figure 3B:
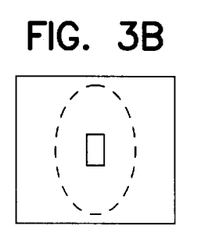
Figure 3C:
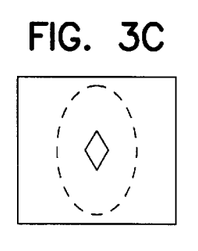
Figure 3D:
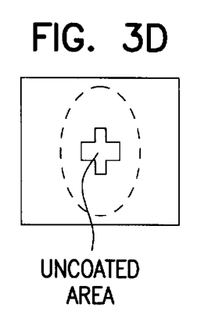
Figures 3E, 3F:
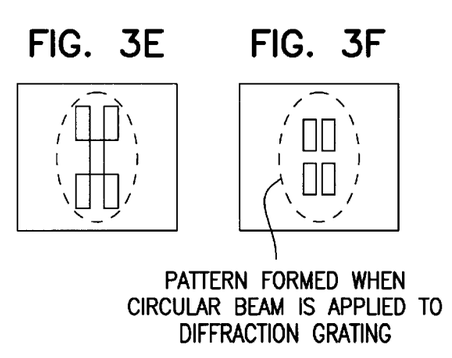
Figure 3G:
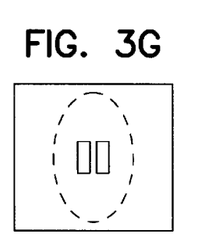
Figure 3H:
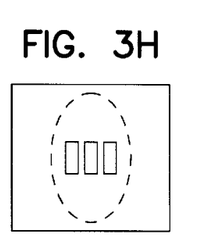

FIG. 3(E) shows one elongate rectangular area on the optical axis 5 and four similar elongate rectangular areas positioned therearound, for passing equal quantities of light therethrough. FIG. 3(F) shows four elongate rectangular areas positioned around the optical axis 5 for passing equal quantities of light therethrough. FIGS. 3(G) and 3(H) show a plurality of elongate rectangular areas positioned linearly on a horizontal line passing through the optical axis 5.

The light transmitting area 30 can be formed by using a mask pattern having one of the above shapes when a reflective film is formed on the diffraction grating, so that no thin metal film, for example, will be formed at the mask pattern.

Alternatively, a reflective film may be formed on the entire surface of the diffraction grating, and then etched by dry etching according to a mask pattern having one of the above shapes.

In this manner, the light transmitting area may be provided as an area where no reflective film is formed.

The light transmitting area 30 may be produced by reducing the reflectivity of a partial or entire area of the reflective film. The reflectivity of the reflective film may be reduced by reducing the thickness of the area of the reflective film using a mask pattern or making the reflective film of a dielectric material. In this fashion, the reflecting surface may be formed partly or wholly as a half mirror to provide a light transmitting area.

(Process of assembling the optical demultiplexer)

A process of assembling the optical demultiplexer according to the present invention will be described with respect to the optical demultiplexer shown in FIG. 2.

The optical demultiplexer comprises an input optical fiber 1, a collimator lens 2, a reflective diffraction grating 3', and a photodetector array 4 as a light detecting means. The reflective diffraction grating 3' has a light transmitting area 30 formed in a portion thereof aligned with the optical axis 5.

The input optical fiber 1, the collimator lens 2, the reflective diffraction grating 3', and the photodetector array 4 are placed in appropriate positions based on an optical design.

Figure 4:
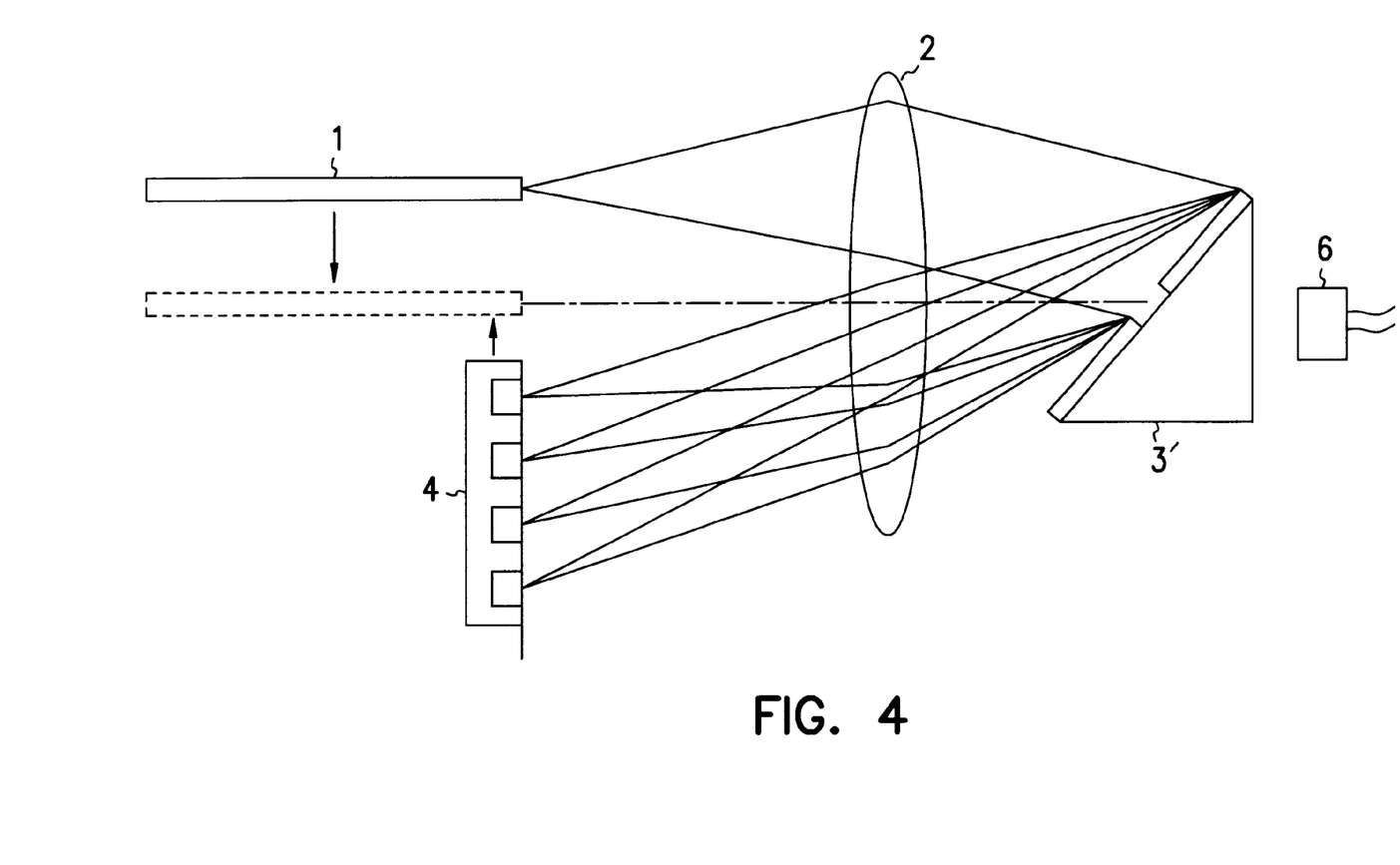
FIG. 4 is a view illustrative of the manner in which the optical demultiplexer shown in FIG. 2 is assembled and adjusted.

It is practically difficult to accurately place the components in position without adjusting their positions. Actually, the components are positioned as shown in FIG. 4, with no abaxial aberration adjusted in any way.

A quantity of light that has passed through the light transmitting area 30 is monitored by a photodetector device 6 positioned behind the reverse side of the reflective diffraction grating 3'. The center of the input optical fiber 1 is adjusted to maximize the monitored quantity of light. The photodetector device 6 may comprise a photodetector, a CCD camera, or a vidicon camera.

The input optical fiber 1, the collimator lens 2, the reflective diffraction grating 3', and the photodetector array 4 can thus be confirmed as being accurately placed in optically designed positions.

Then, the position of the photodetector array 4 is adjusted such that focused beam spots 13 in respective channels which are produced by the reflective diffraction grating 3' and the collimator lens 2 are detected by the detecting surfaces of the photodetectors 40 of the photodetector array 4 placed on the focal plane 20. Specifically, the position of the photodetector array 4 is adjusted to maximize the output power levels of the photodetectors.

In this manner, the optical demultiplexer can easily be assembled by monitoring the light having passed through the reflective diffraction grating and positionally adjusting the photodetectors to maximize the output power levels of the photodetectors. Furthermore, light applied from the input optical fiber 1 to the reflective diffraction grating 3' can be detected for abnormalities.

Figure 5:
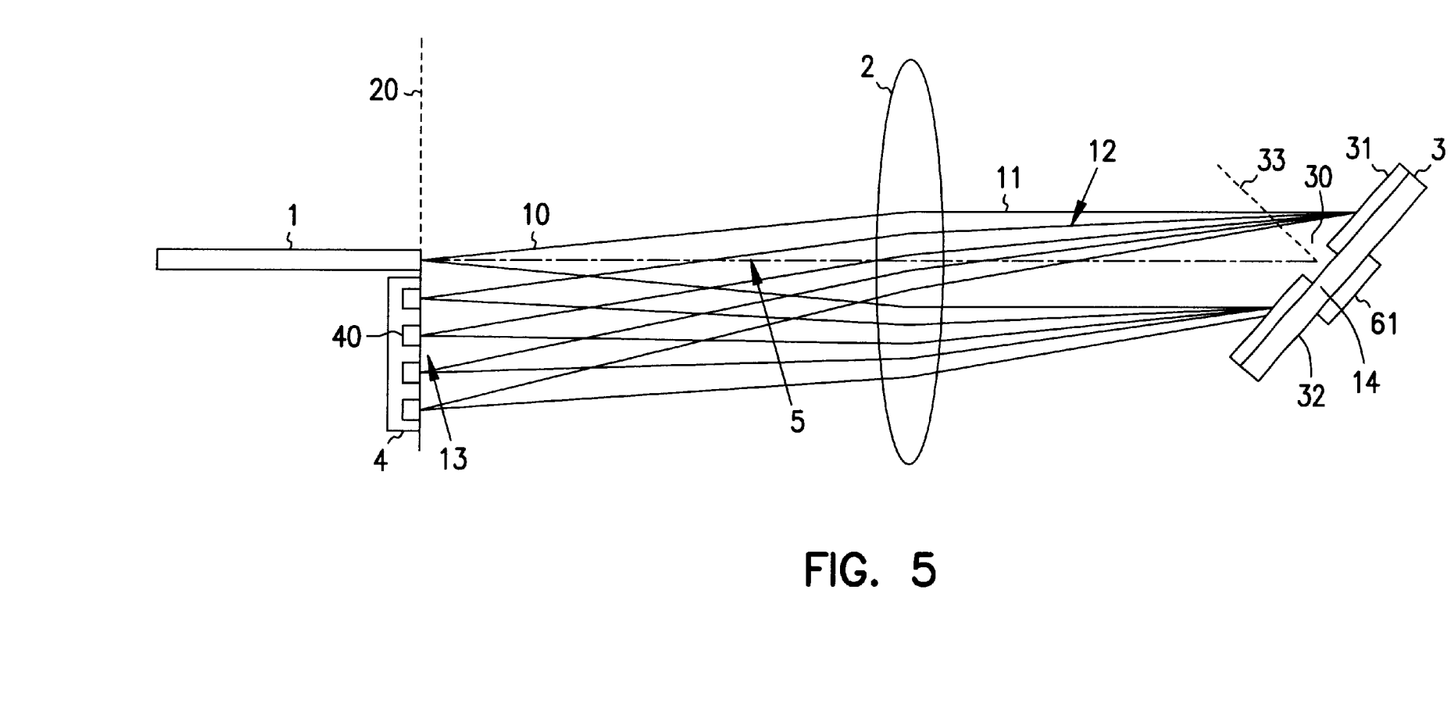
FIG. 5 is a view illustrative of an optical demultiplexer with a photodetector directly disposed on the reverse side of a substrate on which a reflective diffraction grating is formed.

Instead of the photodetector device 6 disposed in spaced relationship to the diffraction substrate, a photodetector 61 may be directly mounted on an exit surface of an angle block 3' on which a diffraction grating is formed (see FIGS. 2 and 5). In this embodiment, light applied from the input optical fiber 1 can be monitored at all times.

(Application 1)

Figure 6:
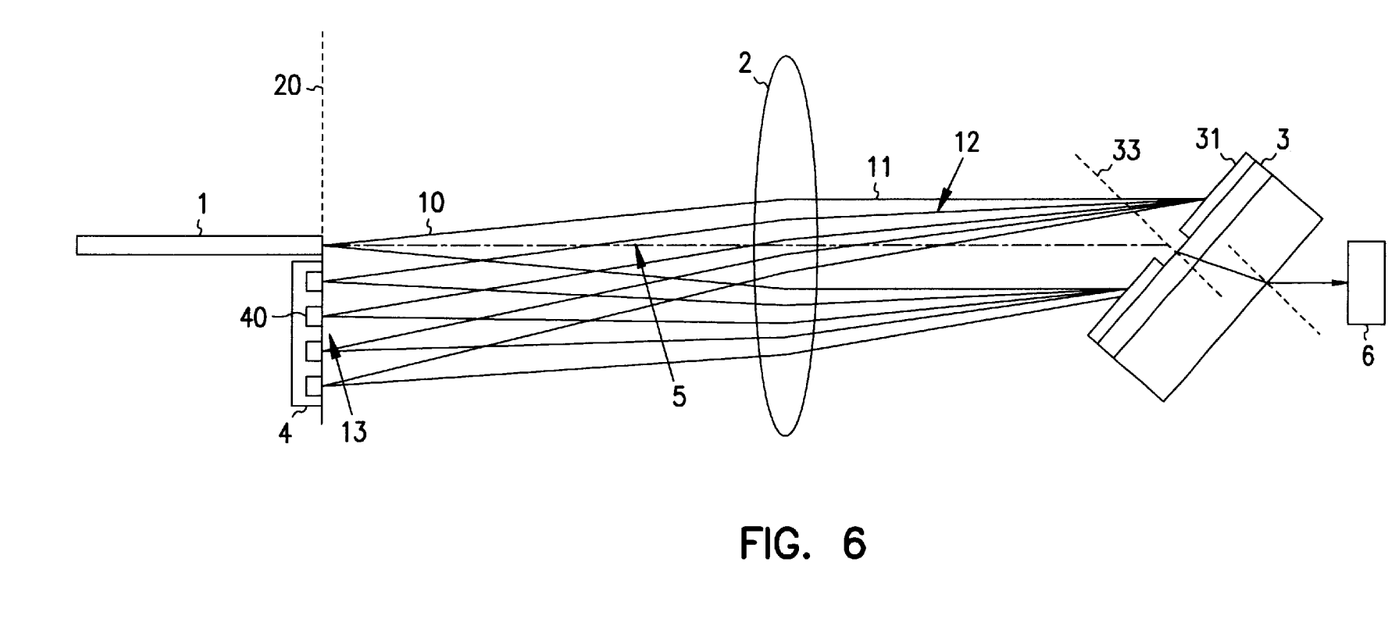
FIG. 6 is a view illustrative of the manner in which light that has entered a substrate of a reflective diffraction grating is emitted from the reverse side of the substrate without being totally reflected in the substrate.

As shown in FIG. 6, the angle of the substrate of the diffraction grating is adjusted such that an angle $\theta_s$ at which light applied to the light transmitting area passes through the diffraction grating and is applied to the reverse side of the substrate becomes smaller than an angle $\theta_t$ of total reflection of the light ($\theta_s < \theta_t$). With the angle thus adjusted, the light applied to the diffraction grating passes through the reverse side of the substrate without being totally reflected in the substrate. This arrangement is suitable for the photodetector device 6 spaced from the reverse side of the substrate to monitor the quantity of light (in FIG. 6, the thickness of the diffraction substrate is shown exaggerated for clearer illustration).

(Applications 2, 3)

Figure 7:
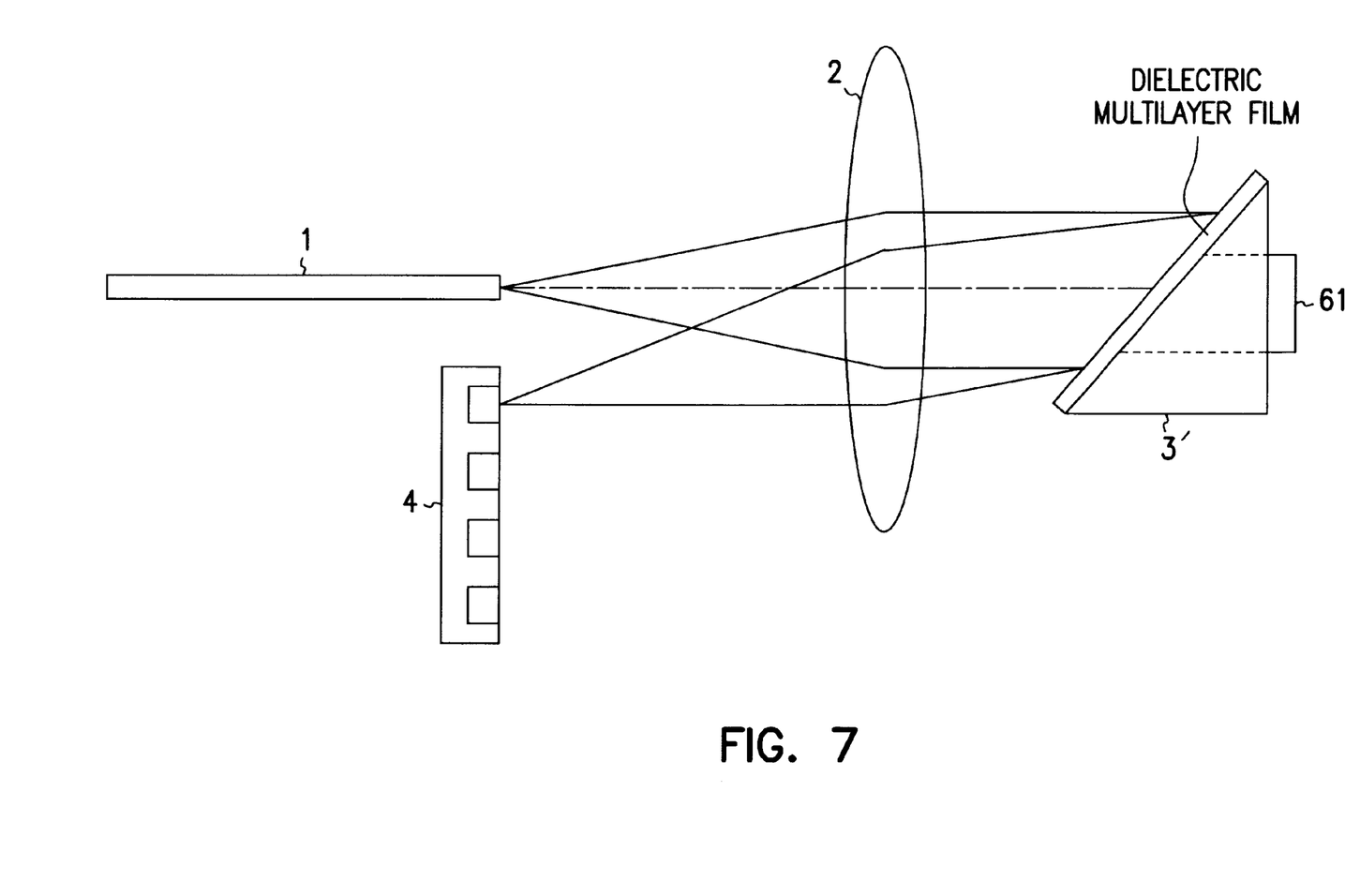
FIG. 7 is a view illustrative of an optical demultiplexer which has a filter function imparted to a reflecting surface and which is capable of monitoring light having a selected wavelength.
Figure 8:
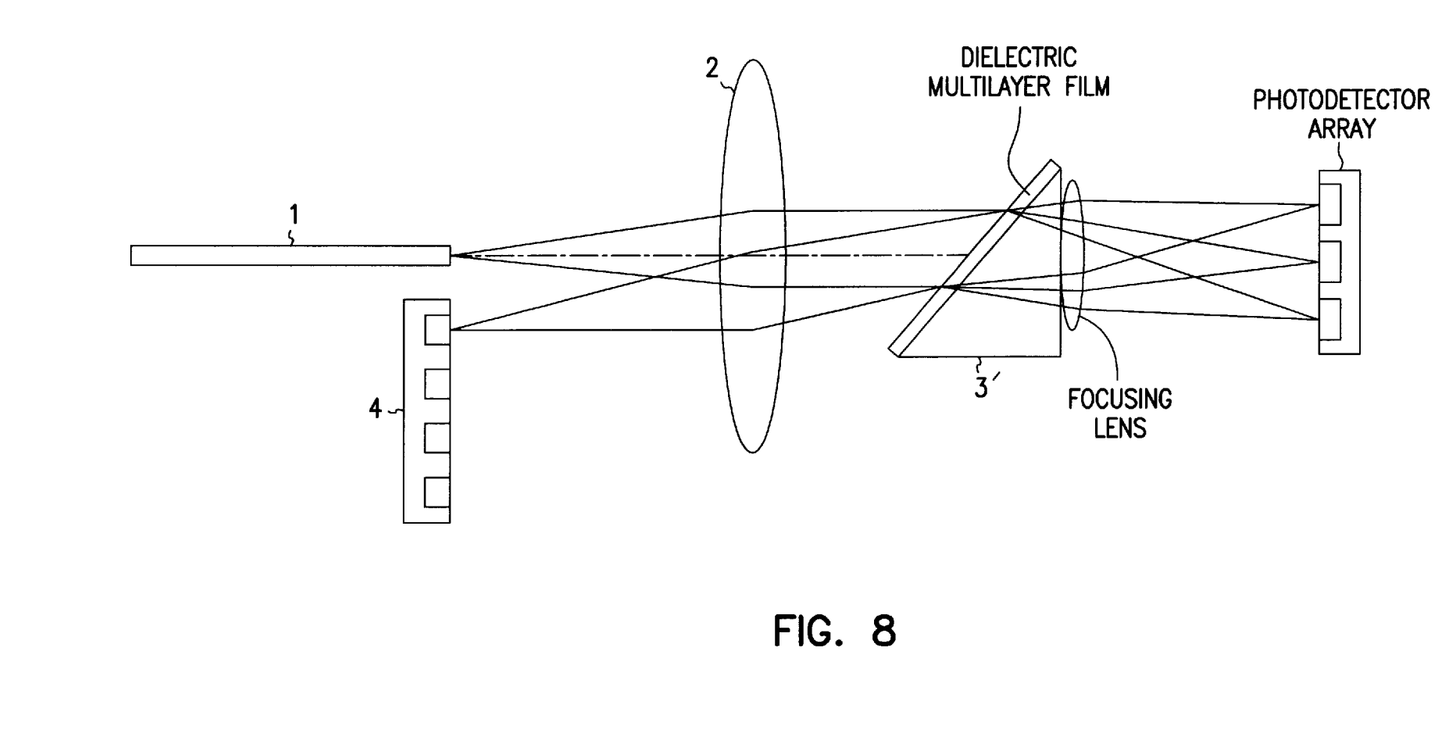
FIG. 8 is a view illustrative of an optical demultiplexer which has a filter function imparted to a reflecting surface and which is capable of focusing light having a selected wavelength with a focusing lens, and detecting and monitoring the focused light with a photodetector array, for example.

In optical demultiplexers shown in FIGS. 7 and 8, the reflecting surface comprises a dielectric multilayer film to impart a bandpass filter function or a sharp cutoff filter function. In this manner, the optical demultiplexers can maintain their function as a reflective optical demultiplexer, and at the same time can selectively measure light in a certain range of wavelengths.

FIG. 7 shows an optical demultiplexer having a photodetector 61 directly mounted on the reverse side of the substrate of a diffraction grating which doubles as an angle block.

FIG. 8 shows an optical demultiplexer having a focusing lens 21 mounted on the reverse side of the substrate of a diffraction grating which doubles as an angle block, and a photodetector array disposed in a position where light is focused by the lens.

(Modifications 1, 2)

Figure 9:
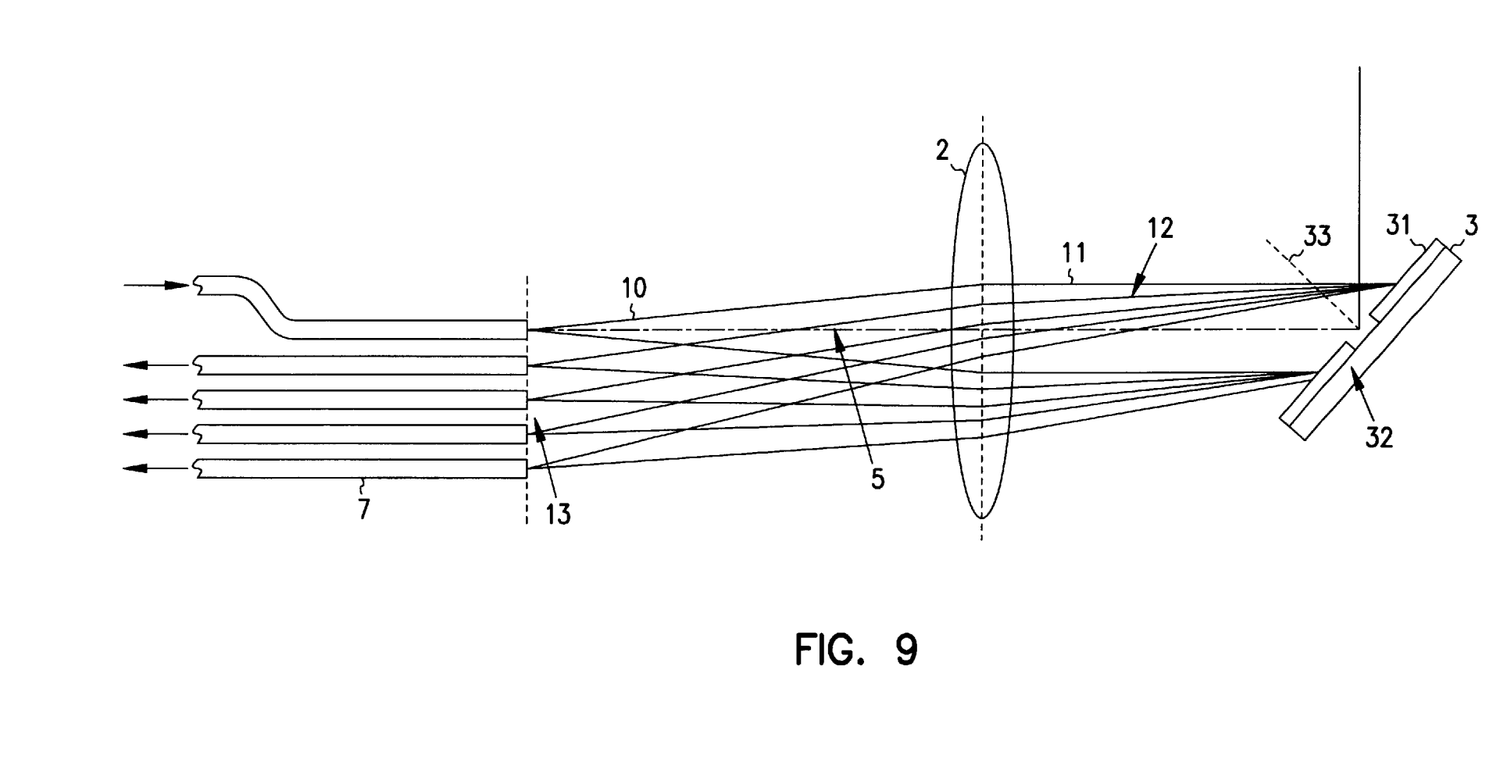
FIG. 9 is a schematic view of an overall optical demultiplexer having an optical fiber array used as a light detecting means.
Figure 10:
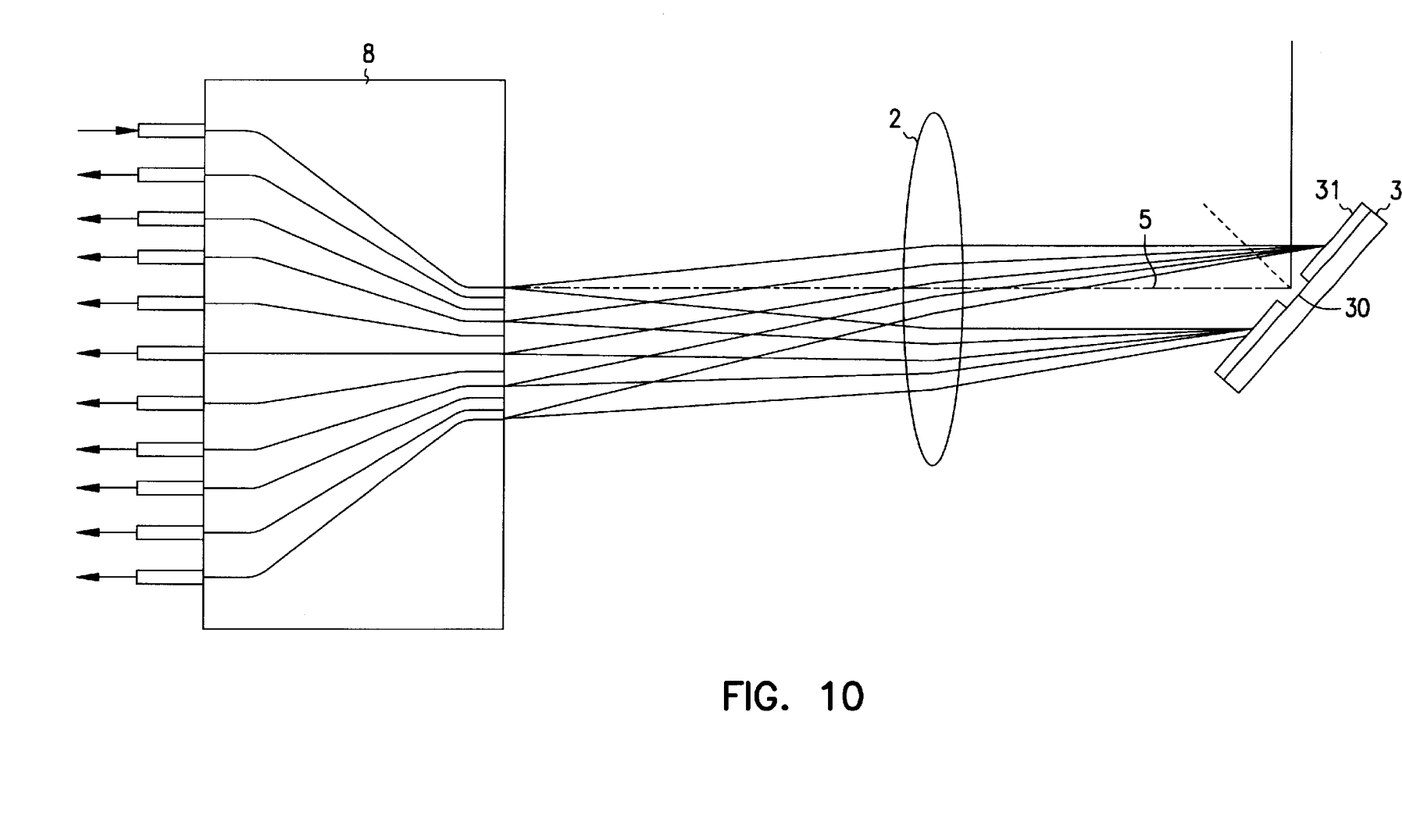
FIG. 10 is a is a schematic view of an overall optical demultiplexer having optical waveguides used as input means and light detecting means.

In the above embodiments and applications, the light detecting means has been shown as comprising a photodetector array. However, the light detecting means is not limited to a photodetector array, but may be an optical fiber array 7 (see FIG. 9) comprising a plurality of optical fibers or a waveguide array 8 (see FIG. 10) comprising a plurality of waveguides.

INDUSTRIAL APPLICABILITY

An optical demultiplexer employing a reflective diffraction grating according to a first aspect of the present invention is capable of monitoring the state of light applied to the diffraction grating. The optical demultiplexer is useful in wavelength division multiplex optical communications.

In a method of assembling an optical demultiplexer according to a second aspect of the present invention, an optical demultiplexer employing a reflective diffraction grating is assembled while the state of light applied to the diffraction grating is being monitored. Therefore, the method makes it possible to assemble and adjust the optical demultiplexer efficiently, and is useful.

What is claimed is:

1. An optical demultiplexer having light input means, a collimator lens, a substrate with a diffraction grating formed thereon, and light detecting means for detecting light demultiplexed by the diffraction grating, characterized in that, said diffraction grating comprises a reflective diffraction grating having a reflecting surface, said light input means and said light detecting means face said reflective diffraction grating with said collimator lens interposed therebetween, said reflecting surface including in at least a portion thereof, a light transmitting area to allow a quantity of light to pass therethrough.

2. An optical demultiplexer according to claim 1, wherein said light transmitting area is an area where said reflecting surface is not formed.

3. An optical demultiplexer according to claim 1, wherein said light transmitting area is an area of low reflectivity.

4. An optical demultiplexer according to claim 1, wherein said substrate is disposed such that an angle at which light applied to said light transmitting area passes through said differaction grating and is applied to the reverse side of said substrate becomes smaller than an angle of total reflection of the light.

5. An optical demultiplexer according to claim 1, further comprising a photodetector for measuring the quantity of light, behind the substrate of said diffraction grating in alignment with said light transmitting area.

6. An optical demultiplexer according to claim 1, wherein said light input means comprises an optical fiber.

7. An optical demultiplexer according to claim 1, wherein said light detecting means comprises one selected from a group consisting of an optical fiber array comprising a plurality of optical fibers, a waveguide array comprising a plurality of waveguides, and a photodetector array comprising a plurality of photodetectors.

8. An optical demultiplexer according to claim 1, further comprising a lens disposed behind the substrate of said diffraction grating, for focusing the quantity of light having passed through said light transmitting area, and photodetector means disposed behind the substrate of said diffraction grating, for detecting the quantity of light which has passed through said light transmitting area and has been focused.

9. An optical demultiplexer according to claim 8, wherein said photodetector means comprises one selected from a group consisting of an optical fiber array comprising a plurality of optical fibers, a waveguide array comprising a plurality of waveguides, and a photodetector array comprising a plurality of photodetectors.

10. A method of assembling an optical demultiplexer having light input means, a collimator lens, a reflective diffraction grating, and light detecting means for detecting light demultiplexed by the diffraction grating, characterized in that, said reflective diffraction grating comprises a reflective diffraction grating having a reflecting surface, said light input means and said light detecting means face said reflective diffraction grating with said collimator lens interposed therebetween, said reflecting surface includes a light transmitting area in at least a portion thereof, and the components are adjusted while light having passed through the light transmitting area is being monitored.

11. A method of assembling an optical demultiplexer having light input means, a collimator lens, a diffraction grating, and light detecting means for detecting light demultiplexed by the diffraction grating wherein said light input means comprises an input optical fiber, and said light detecting means comprises a photodetector array for detecting, via said collimator lens, a group of focused beam spots demultiplexed and scattered by said reflective diffraction grating, said diffraction grating comprises a reflective diffraction grating having a reflecting surface, said reflecting surface includes a light transmitting area in at least a portion thereof, and the components are adjusted while light having passed through the light transmitting area is being monitored, the method comprising:

adjusting the center of said input optical fiber with respect to an optical axis of said optical demultiplexer to maximize a monitored quantity of light having passed through said light transmitting area; and positionally adjusting said photodetector array to maximize an output power level of said photodetector array.

* * * * *